United States Patent
Ajoian et al.

(10) Patent No.: US 9,832,865 B2
(45) Date of Patent: Nov. 28, 2017

(54) METHODS AND DEVICES FOR PROVIDING INCREASED ROUTING FLEXIBILITY IN MULTI-LAYER PRINTED CIRCUIT BOARDS

(71) Applicant: Avago Technologies General IP (Singapore) Pte. Ltd., Singapore (SG)

(72) Inventors: Jack Ajoian, Campbell, CA (US); Padam Jain, Castro Valley, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/138,309

(22) Filed: Apr. 26, 2016

(65) Prior Publication Data

US 2017/0311444 A1 Oct. 26, 2017

(51) Int. Cl.
*H05K 1/09* (2006.01)
*H05K 1/02* (2006.01)
*H05K 1/11* (2006.01)
*H05K 1/14* (2006.01)
*H05K 3/10* (2006.01)
*H05K 3/46* (2006.01)

(52) U.S. Cl.
CPC ......... *H05K 1/0298* (2013.01); *H05K 1/0242* (2013.01); *H05K 1/115* (2013.01); *H05K 1/144* (2013.01); *H05K 3/10* (2013.01); *H05K 3/105* (2013.01); *H05K 3/4644* (2013.01); *H05K 2201/09281* (2013.01)

(58) Field of Classification Search
CPC ........ H05K 1/115; H05K 1/116; H05K 1/144; H05K 1/242; H05K 1/298; H05K 3/10; H05K 3/35; H05K 3/40; H05K 3/42; H05K 3/105; H05K 3/4644; H01R 4/58; H01L 21/48; H01L 21/56; H01L 21/78; H01L 23/52; H01L 23/498
USPC ........ 174/251, 255, 260, 261, 262; 438/107, 438/121, 126, 611, 666; 257/664, 678, 257/698, 700, 713, 723, 737, 774; 439/85, 86, 91
See application file for complete search history.

(56) References Cited

U.S. PATENT DOCUMENTS

| | | | | |
|---|---|---|---|---|
| 5,841,193 | A * | 11/1998 | Eichelberger | H01L 23/5389 257/723 |
| 6,346,678 | B1 * | 2/2002 | Kono | H05K 3/0035 174/255 |
| 7,025,607 | B1 * | 4/2006 | Das | H01G 4/206 439/85 |
| 7,402,758 | B2 | 7/2008 | Mattix | |
| 9,204,533 | B2 * | 12/2015 | Christian | H05K 1/0251 |
| 2002/0102831 | A1 * | 8/2002 | Hui | H01L 23/3114 438/611 |

(Continued)

*Primary Examiner* — Xiaoliang Chen

(57) ABSTRACT

A build-up process for fabricating a multi-layer PCB is provided during which a mezzanine redistribution, or routing, structure is formed within one of the PCB dielectric material layers that allows additional electrical interconnections (i.e., traces and crossovers) to be made within that layer, thereby obviating the need to add an additional PCB layer in order to make those interconnections. The mezzanine redistribution structure also can be interconnected with the metal layers that are above and below it to further increase routing complexity and flexibility. The mezzanine redistribution structure can be formed without increasing the total thickness of the PCB and without substantially increasing costs.

20 Claims, 7 Drawing Sheets

(56) References Cited

U.S. PATENT DOCUMENTS

| | | | |
|---|---|---|---|
| 2002/0136873 A1* | 9/2002 | Li | H05K 3/4038 428/209 |
| 2006/0151863 A1* | 7/2006 | Das | H01L 23/49822 257/678 |
| 2010/0213601 A1* | 8/2010 | Smeys | H01L 21/4853 257/698 |
| 2010/0213602 A1* | 8/2010 | Smeys | H01L 21/4853 257/698 |
| 2010/0213603 A1* | 8/2010 | Smeys | H01L 21/4853 257/698 |
| 2010/0213604 A1* | 8/2010 | Smeys | H01L 21/4853 257/700 |
| 2010/0213607 A1* | 8/2010 | Smeys | H01L 21/4853 257/723 |
| 2010/0216280 A1* | 8/2010 | Smeys | H01L 21/4853 438/107 |
| 2011/0163457 A1* | 7/2011 | Mohan | H01L 21/4853 257/774 |
| 2011/0215464 A1* | 9/2011 | Guzek | H01L 21/568 257/737 |
| 2012/0021565 A1* | 1/2012 | Gong | H01L 21/6835 438/121 |
| 2012/0133052 A1* | 5/2012 | Kikuchi | H01L 23/49827 257/774 |
| 2012/0153493 A1* | 6/2012 | Lee | H01L 25/16 257/774 |
| 2015/0145108 A1* | 5/2015 | Yap | H01L 21/768 257/664 |
| 2016/0021754 A1* | 1/2016 | Chen | H05K 1/185 361/761 |
| 2016/0141234 A1* | 5/2016 | We | H01L 23/5385 361/767 |
| 2016/0163632 A1* | 6/2016 | Chen | H01L 23/49827 257/774 |
| 2016/0240391 A1* | 8/2016 | Chen | H01L 23/49816 |
| 2016/0240480 A1* | 8/2016 | Lin | H01L 23/3135 |
| 2016/0240508 A1* | 8/2016 | Hou | H01L 23/528 |
| 2017/0033090 A1* | 2/2017 | Hsieh | H01L 25/105 |

* cited by examiner

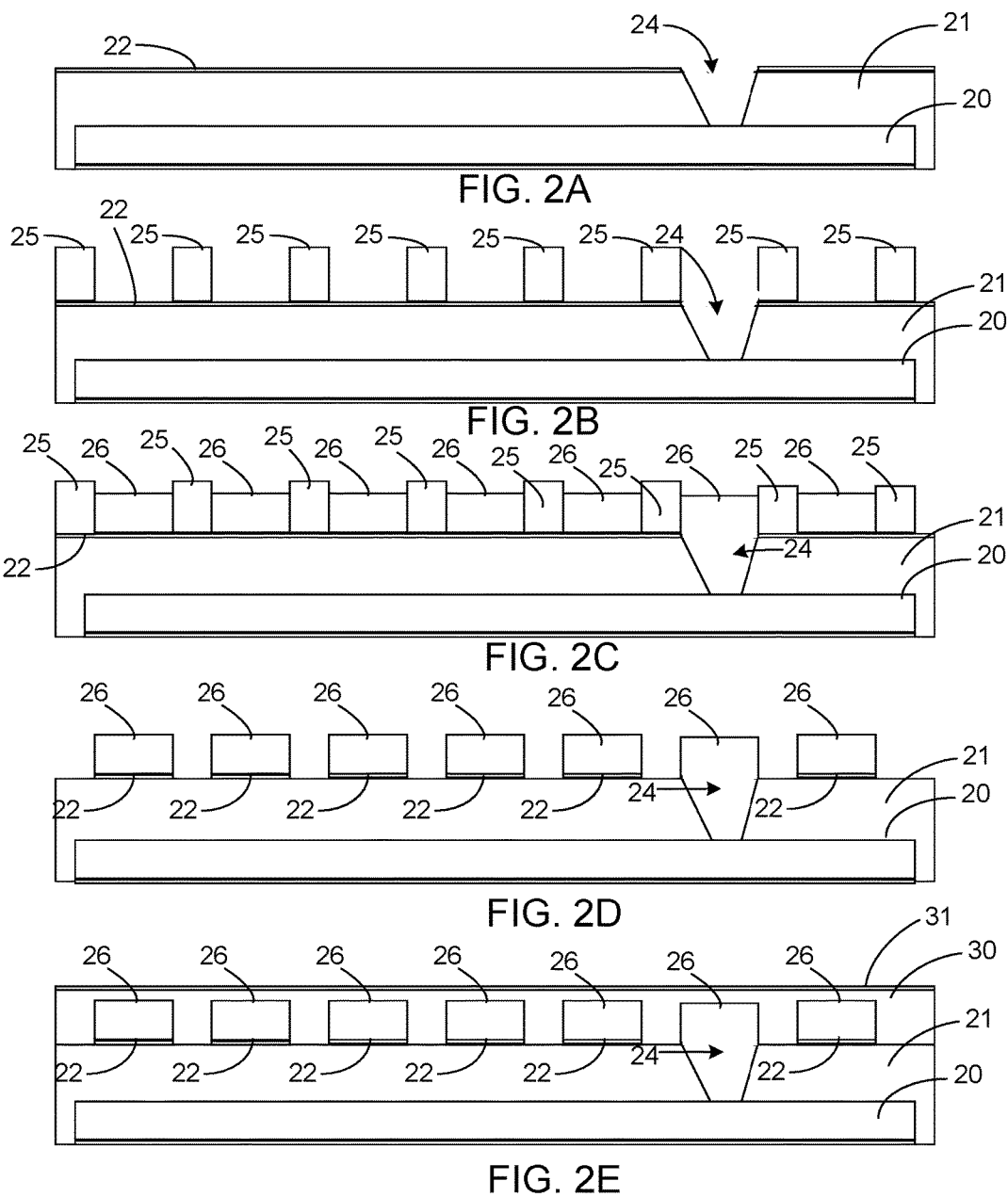

US 9,832,865 B2

METHODS AND DEVICES FOR PROVIDING INCREASED ROUTING FLEXIBILITY IN MULTI-LAYER PRINTED CIRCUIT BOARDS

FIELD OF THE INVENTION

The invention relates to multi-layer printed circuit boards (PCBs), and more particularly, to a multi-layer PCB having increased signal routing flexibility while avoiding the need to increase the total number of traditional layers of the PCB and the total thickness of the PCB.

BACKGROUND

Multi-layer PCBs are used in a variety of electrical, electronic and optoelectronic applications for mounting and electrically interconnecting electrical, electronic and/or optoelectronic components. A typical multi-layer PCB comprises layers of organic dielectric substrate material, typically referred to as prepreg, having layers of metal embedded therein that are often patterned to provide electrical signal routing. The metal layers are often interconnected by electrically-conductive vias to allow the electrical signals to be routed vertically through multiple layers of the PCB.

A typical multi-layer PCB manufacturing process is a build-up process in which the layers are built one layer at a time. The build-up process typically comprises using dry dielectric film masking steps to selectively mask regions of a metal seed layer disposed on a starting structure, electroplating onto the unmasked regions of the metal seed layer to form a patterned metal layer, removing the dry dielectric film layer and the metal seed layer below it, laminating a layer of dielectric prepreg material on top of the patterned metal layer, drilling one or more via holes through the laminated dielectric prepreg, cleaning the via holes, forming a metal seed layer on the walls of the via holes, and electroplating metal onto the via holes and onto the non-masked areas of the seed layer to simultaneously fill the via holes with metal and form the patterned metal layer. The process is then repeated to form each additional PCB layer.

In many multi-layer PCBs, the electrical signal routing is often separated into radio frequency (RF) signal routing and digital signal routing. A metal electrical isolation layer is typically located in between the layers that contain the digital signal routes and the layers that contain the RF signal routes in order to electrically isolate them from one another to prevent electrical crosstalk between them. An electrical ground layer for the PCB is typically located in a layer beneath the layer that contains the digital signal routes. In other words, the layer that contains the digital signal routes is sandwiched in between the PCB layer that contains the metal electrical isolation layer and the PCB layer that contains the metal ground layer.

FIGS. 1A-1H illustrate cross-sectional views of a plurality of layers of a multi-layer PCB as they are being built up during the aforementioned known fabrication process. With reference to FIG. 1A, a first PCB layer is shown that includes a first metal layer 2 and a first dielectric material layer 3. The first dielectric material layer 3 is typically a layer of prepreg material that is laminated on top of the first metal layer 2. The term "prepreg material" denotes a reinforcing fabric made of woven composite fibers that is impregnated with a resin system (e.g., epoxy) that bonds the composite fibers together. The back side of the prepreg laminate that forms the first dielectric material layer 3 is typically covered with a copper foil layer 4. At least one via hole 5 is typically formed through the first dielectric material layer 3 to allow electrical contact to be established between the first metal layer 2 and one or more subsequently formed metal layers (not shown). The first metal layer 2 and the first dielectric layer 3 together form a single layer of the multi-layer PCB. The first metal layer 2 may be patterned or unpatterned, but for exemplary purposes it will be assumed that the first metal layer 2 is an unpatterned electrical ground layer that constitutes the bottom layer of the multi-layer PCB.

With reference to FIG. 1B, a first dry dielectric film is laminated on top of the copper foil layer 4 and patterned by photolithography (i.e., exposed in predetermined locations to radiation and developed away) to form a dielectric film mask 7. With reference to FIG. 1C, an electroplating process is performed to form a patterned metal layer 8 on the exposed areas of the copper foil layer 4, i.e., on the areas of the copper foil layer 4 that are not masked by the dielectric film mask 7. Simultaneously with the formation of the patterned metal layer 8, the via hole 5 is filled with metal. Prior to forming the dielectric film mask 7, patterning metal layer 8 and filling the via hole 5, an electroless process is performed to deposit a thin layer of metal on the surfaces of the via hole 5 so that the metal that is subsequently electroplated will adhere to the surfaces of the via hole 5. For ease of illustration, the electroless process is not depicted.

With reference to FIG. 1D, after the patterned metal layer 8 is formed and the via hole 5 is filled, the dielectric film mask 7 is stripped off and the copper foil layer 4 is etched away. For exemplary purposes, it will be assumed that the patterned metal layer 8 is the digital signal routing, or redistribution, layer of the multi-layer PCB. With reference to FIG. 1E, a second dielectric material layer 11, that is also a prepreg laminate layer having the same metal-to-metal thickness as the first dielectric material layer 3, is then laminated on top of the patterned metal layer 8. The back side of the prepreg laminate layer has a copper foil layer 12 on it that is identical to copper foil layer 4.

With reference to FIG. 1F, a via hole 14 may be laser-drilled into the second dielectric material layer 11. With reference to FIG. 1G, a second dry film dielectric layer is laminated on top of the copper foil layer 12, exposed to radiation and developed away, leaving a dielectric film mask 15 on top of the copper foil layer 12. With reference to FIG. 1H, a patterned third layer of metal 17 is then electroplated onto the non-masked areas of the copper foil layer 12, including in the via hole 14. For exemplary purposes, it will be assumed that the patterned third layer of metal 17 is the aforementioned electrical isolation metal layer that electrically isolates the digital routing layer 8 from one or more RF signal routing layers (not shown) that are on the opposite side of the electrical isolation metal layer 17 from the digital routing layer 8.

The process described above with reference to FIGS. 1A-1H continues until the PCB has the intended number of PCB layers. Each PCB layer, as that term is used herein, includes a layer of metal, which may or may not be patterned, and a layer of prepreg that is laminated onto the layer of metal. Thus, in FIG. 1H, the first metal layer 2 and the first dielectric material layer 3 together constitute a first PCB layer and the second metal layer 8 and the second dielectric material layer 11 together constitute a second PCB layer.

One of the difficulties associated with this type of PCB design process is that if additional digital signal routing is needed to interconnect (i.e., cross overs of traces) digital signal routes of metal layer 8, an additional PCB layer must be added between the aforementioned second and third PCB layers because the digital signal routes cannot be routed into the layer above the electrical isolation layer 17 or below the metal ground layer 2, which is typically the bottom surface of the PCB that serves as an interface between the PCB and external circuitry of a motherboard. Adding additional PCB layers may not be possible or practical due to total thickness requirements of the PCB and/or due to cost constraints. At the same time, there is a counter-challenge in the PCB manufacturing industry to decrease costs and total PCB thickness.

Accordingly, a need exists for a way to increase routing flexibility in multi-layer PCBs without increasing the total number of traditional layers of the PCBs, the total thickness of the PCBs or the PCB manufacturing costs.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale, emphasis instead being placed upon illustrating the principles of the invention. The drawings should not be interpreted as limiting the scope of the invention to the example embodiments shown herein.

FIGS. 2A-2L illustrate cross-sectional views of a multi-layer PCB as it is built up during fabrication to include a mezzanine redistribution structure that is embedded within one of the layers of the multi-layer PCB.

WRITTEN DESCRIPTION

Figure 1A:
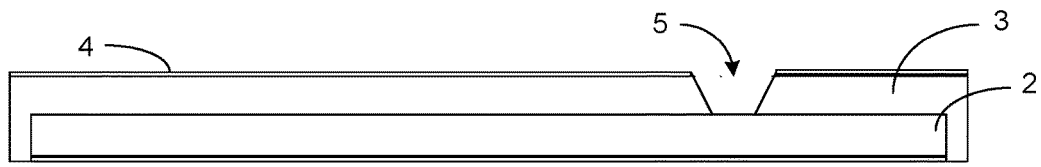
FIGS. 1A-1H illustrate cross-sectional views of a plurality of layers of a multi-layer PCB as they are being built up during the aforementioned known fabrication process.
Figure 1B:
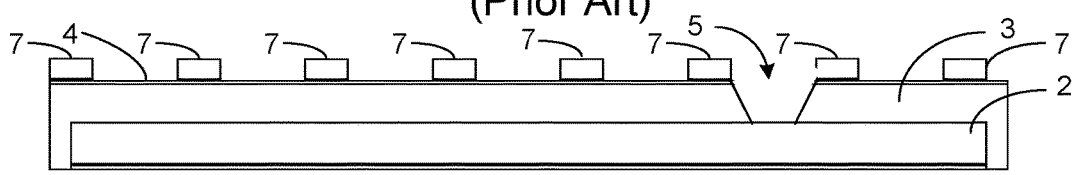
Figure 1C:
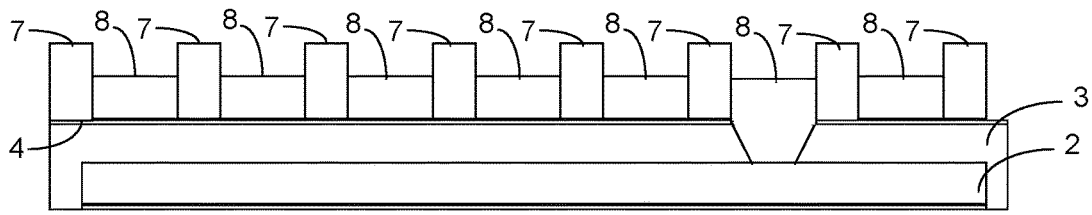
Figure 1D:
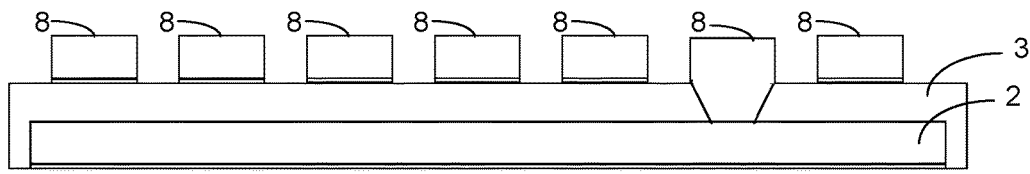
Figure 1E:
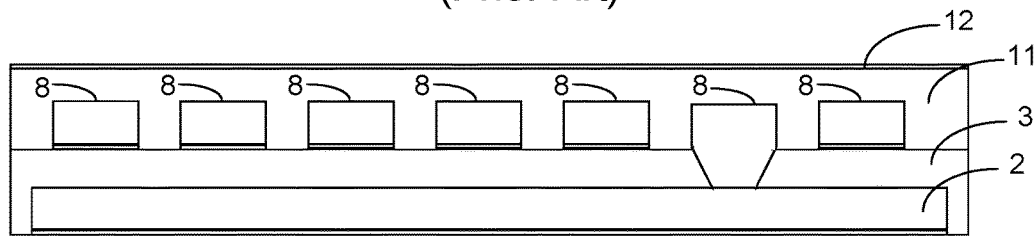
Figure 1F:
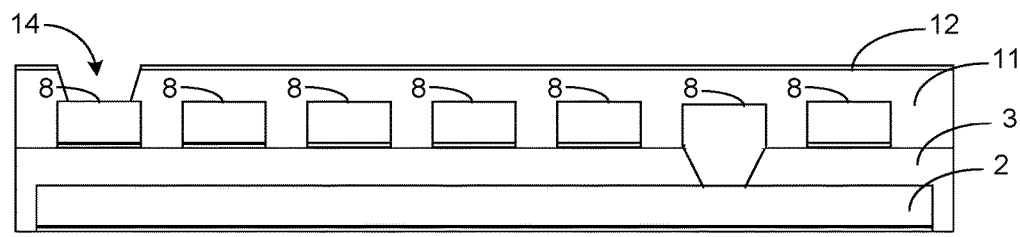
Figure 1G:
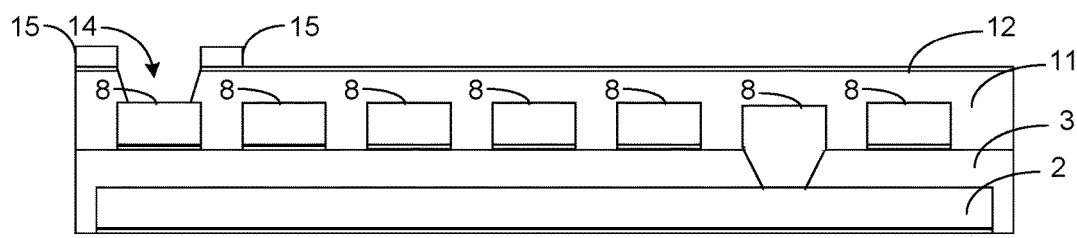
Figure 1H:
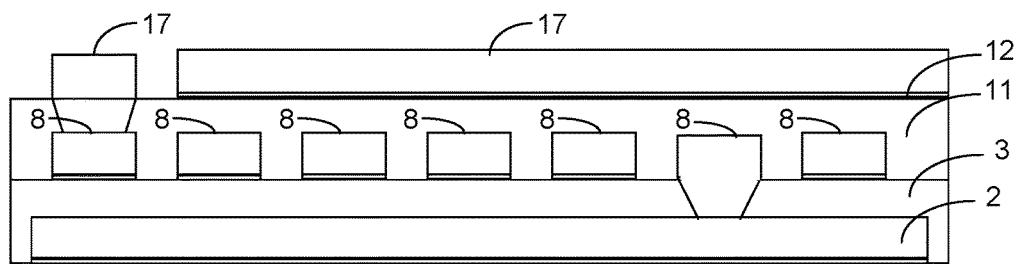

Throughout this description, embodiments and variations are described for the purpose of illustrating uses and implementations of inventive concepts. The illustrative description should be understood as presenting examples of inventive concepts, rather than as limiting the scope of the concept as disclosed herein. It should be further understood that certain words and terms are used herein solely for convenience and such words and terms should be interpreted as referring to various objects and actions that are generally understood in various forms and equivalencies by persons of ordinary skill in the art. It should also be understood that the word "example," as used herein, is intended to be non-exclusionary and non-limiting in nature. More particularly, the word "exemplary" as used herein indicates one among several examples, and it must be understood that no undue emphasis or preference is being directed to the particular example being described.

In terms of a general overview, a build-up process for fabricating a multi-layer PCB is provided during which a mezzanine redistribution, or routing, structure is formed within one of the PCB dielectric layers that allows additional electrical interconnections (i.e., traces and crossovers) to be made within that PCB layer, thereby obviating the need to add an additional PCB layer in order to make those interconnections. The mezzanine redistribution structure also can be interconnected with the metal layers that are above and below it to further increase routing complexity and flexibility. The mezzanine redistribution structure can be formed without increasing the total thickness of the PCB and without substantially increasing costs. A few illustrative embodiments of the build-up process will now be described with reference to the figures.

The term "multi-layer PCB" or "multi-layer circuit board," as those terms are used herein, are intended to denote any multi-layer structure that is manufactured to include multiple layers of dielectric material and multiple layers of metal, at least some of which are patterned into signal routes or traces and at least some of which are interconnected by electrically-conductive vias. Thus, the terms "multi-layer PCB" and "multi-layer circuit board" denote, for example, typical multi-layer PCBs manufactured in the manner described above with reference to FIGS. 1A-1H, multi-layer printed wiring boards (PWBs), and multi-layer substrates.

FIGS. 2A-2K illustrate cross-sectional views of a multi-layer PCB as it is built up during fabrication to include a mezzanine redistribution structure that is embedded within one of the dielectric material layers of the multi-layer PCB. FIGS. 2A-2D represent steps described above that are currently performed in known build-up fabrication processes used to fabricate multi-layer PCBs. FIGS. 2E-2K represent steps in accordance with an exemplary embodiment that are performed to form the mezzanine redistribution structure within one of the layers of the multi-layer PCB without increasing the thickness of the PCB and without adding an additional PCB layer. For ease of illustration and discussion, some steps are not explicitly shown.

With reference to FIG. 2A, a first PCB layer is shown that includes a first metal layer 20 and a first dielectric material layer 21. The first dielectric material layer 21 is typically a prepreg material layer that is laminated on top of the first metal layer 20. The back side of the prepreg laminate that forms first dielectric material layer 21 is typically covered with a copper foil 22. In accordance with this exemplary embodiment, at least one via hole 24 is formed through the first dielectric material layer 21 to allow electrical contact to be established between the first metal layer 20 and one or more subsequently formed metal layers (not shown). The first metal layer 20 and the first dielectric material layer 21 together form a single layer of the multi-layer PCB. For exemplary purposes, it will be assumed that the first metal layer 20 is an electrical ground layer that constitutes the bottom layer of the multi-layer PCB.

With reference to FIG. 2B, a first dry dielectric film is deposited on top of the copper foil 22 and patterned (i.e., exposed in predetermined locations to radiation and developed away) to form a dry dielectric film mask 25. With reference to FIG. 2C, an electroplating process is performed to form a patterned metal layer 26 on the exposed areas of the copper foil layer 22, which acts as a metal seed layer for the electroplating steps that follow. Prior to forming the dielectric film mask 25, patterning metal layer 26 and filling the via hole 24, an electroless process is performed to deposit a thin layer of metal on the surfaces of the via hole 24 so that the metal that is subsequently electroplated will adhere to the surfaces of the via hole 24. For ease of illustration, the electroless process is not depicted.

With reference to FIG. 2D, after the patterned metal layer 26 is formed, the dry dielectric film mask 25 is stripped off and the copper foil layer 22 that is not covered by the patterned metal layer 26 is etched away. For exemplary purposes, it will be assumed that the patterned metal layer 26 is the digital signal redistribution layer of the multi-layer PCB. The steps represented by FIGS. 2A-2D are identical to steps 1A-1D, respectively.

With reference to FIG. 2E, a photo-imageable dielectric (PID) laminate 30 is laminated on top of the patterned metal layer 26. The PID laminate 30 has a copper foil layer 31. The PID laminate 30 is a product offered by a company called Taiyo Ink Manufacturing Company, Ltd., of Japan. The PID laminate 30 has properties that make it well suited for use with PCB manufacturing processes, including good adhesion to metals, flowability such that the patterned metal layer 26 is immersed in it, good uniformity in that its top surface maintains uniformity across the width of the patterned metal layer 26, good dielectric characteristics, photo-imageable such that selected portions can be exposed to a particular wavelength of light and developed away to remove them without having to laser ablate, and compatibility with the range of temperatures used during the PCB manufacturing process. The term "photo-imageable dielectric" or "PID" material, as those terms are used herein, denote a dielectric material that is capable of being patterned by exposing selected portions of the material to a particular wavelength of light and then removing the exposed portions without the need for drilling. The process of exposing selected portions of the PID material 30 can be performed using a laser direct imaging (LDI) process, which is a known process that does not require masking.

Figure 2F:
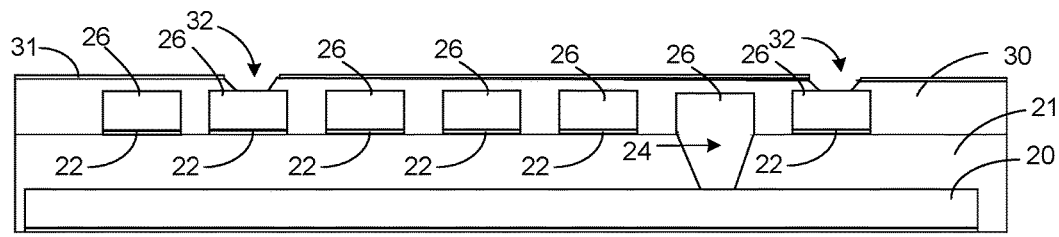

Prior to performing the LDI process, direct laser drilling is used to drill via holes 32 through the copper foil layer 32 and into the PID material 30, as shown in FIG. 2F. The aforementioned electroless process is performed to deposit a thin layer of metal (not shown) on the surfaces of the via holes 32 so that the metal that is subsequently electroplated will adhere to the surfaces of the via holes 32.

Figure 2G:
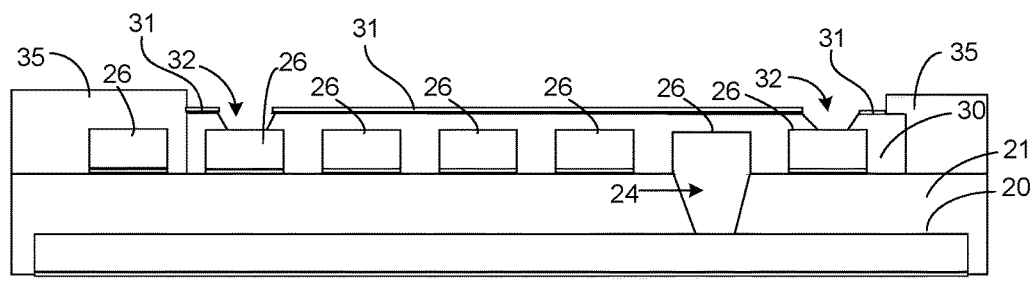
Figure 2H:
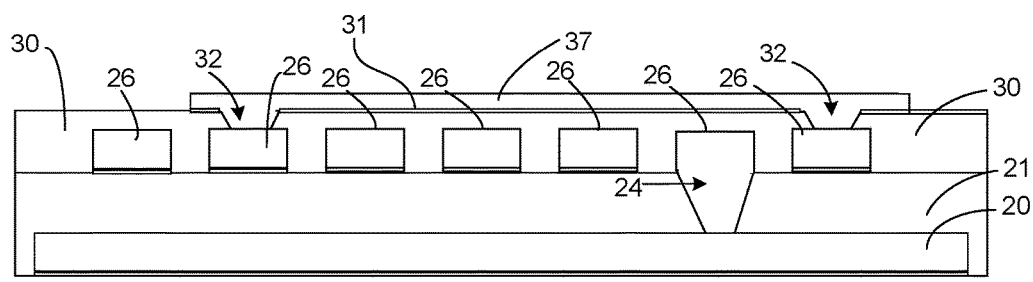

With respect to FIG. 2G, a dry dielectric film mask 35 is formed on top of the PID laminate 30 that covers areas of the PID laminate 30 that are not to be electroplated during a subsequent electroplating process. The areas of the PID laminate 30 that are not protected by the dry dielectric film mask 35 are then electroplated with a metal layer 37. The dry dielectric film mask 35 is then stripped away leaving the structure shown in FIG. 2H. The combination of the PID laminate 30, the metal layer 37 and the metal-filled via holes 32 comprises the mezzanine redistribution structure.

Figure 2I:
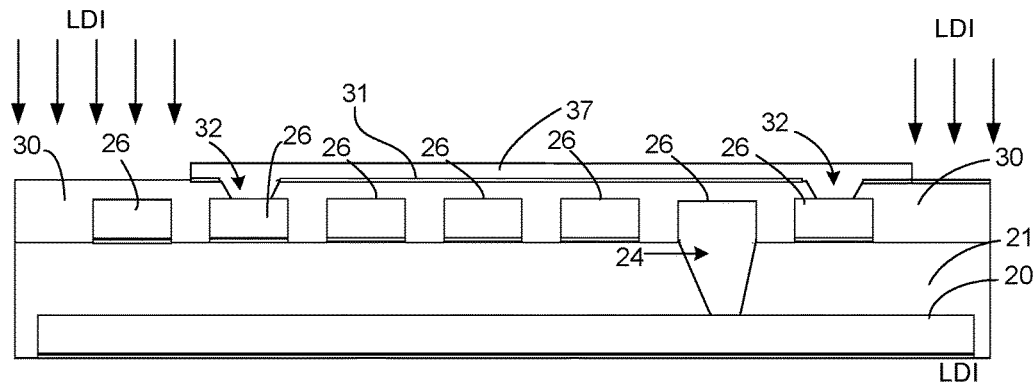
Figure 2J:
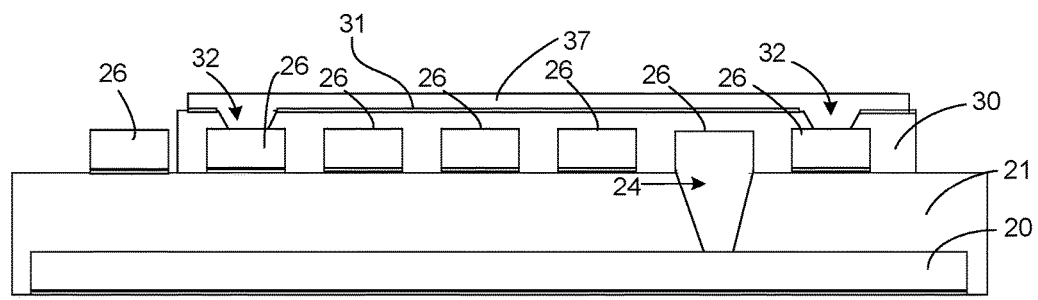

With reference to FIG. 2I, portions of the PID material 30 that are to be removed are then photo-imaged using an LDI process. The photo-imaged portions of the PID material 30 are then developed away, leaving the structure shown in FIG. 2J. The patterned metal layer 26 and the mezzanine redistribution structure 30, 37, 32 are then covered with a dielectric material layer 41 having a copper foil layer 42 on its upper surface, as shown in FIG. 2K.

In order to avoid increasing the thickness of the PCB, the height of the mezzanine redistribution structure 30, 37, 32, i.e., the vertical distance from the top of the first dielectric material layer 21 to the top of the metal layer 37, must be less than the thickness of the dielectric material layer 41. Currently, the standard thickness of a dielectric material layer used in the type of build-up process being described herein is about 30 micrometers. In order to ensure that the height of the mezzanine redistribution structure 30, 37, 32 is less than about 30 micrometers, the composition of the dielectric material layer 41 may need to be different than that of the dielectric material layer 21, which is typically made of prepreg. In accordance with an embodiment, the dielectric material layer 41 is made of glassless prepreg, which can be the same resin material used in prepreg, but does not include the fiberglass that is woven throughout prepreg. Using glassless prepreg for this purpose allows the dielectric material layer 41 to be thinner and ensures that lamination voids will not occur at the interface between the metal layer 37 and the dielectric material layer 41. In other embodiments, the dielectric material layer 41 is made of normal prepreg that includes woven fiberglass.

Figure 2K:
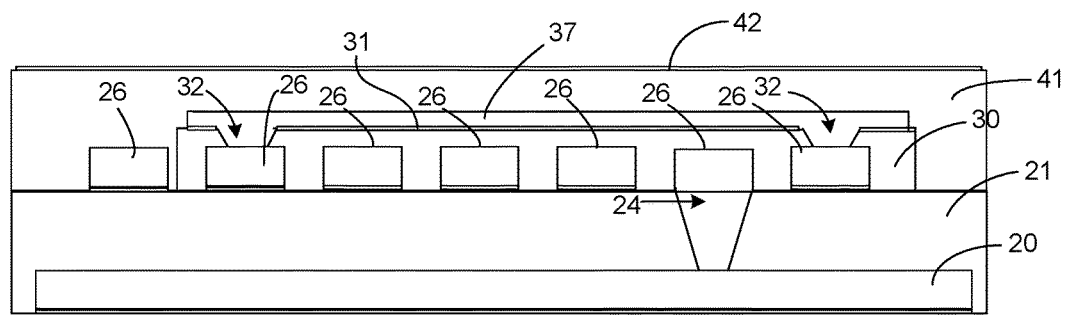

As shown in FIG. 2K, the metal layer 37 of the mezzanine redistribution structure 30, 37, 32 provides additional electrical interconnections to the patterned metal layer 26 within the dielectric material layer 41. Thus, additional routing complexity within the digital signal redistribution layer comprising patterned metal layer 26 and dielectric material layer 41 is achieved without having to add an additional PCB layer by embedding the mezzanine redistribution structure 30, 37, 32 within a PCB dielectric material layer 41. In addition, the additional routing complexity has been achieved without increasing the total thickness of the PCB because the thickness of the PCB layer that contains the mezzanine redistribution structure 30, 37, 32 has not changed. In some embodiments, the mezzanine redistribution structure 30, 37, 32 may increase the total thickness of the PCB. However, even in cases where the mezzanine redistribution structure 30, 37, 32 increases the total thickness of the PCB, it still would not increase the total PCB thickness to the extent that adding another traditional PCB layer would.

Figure 2L:
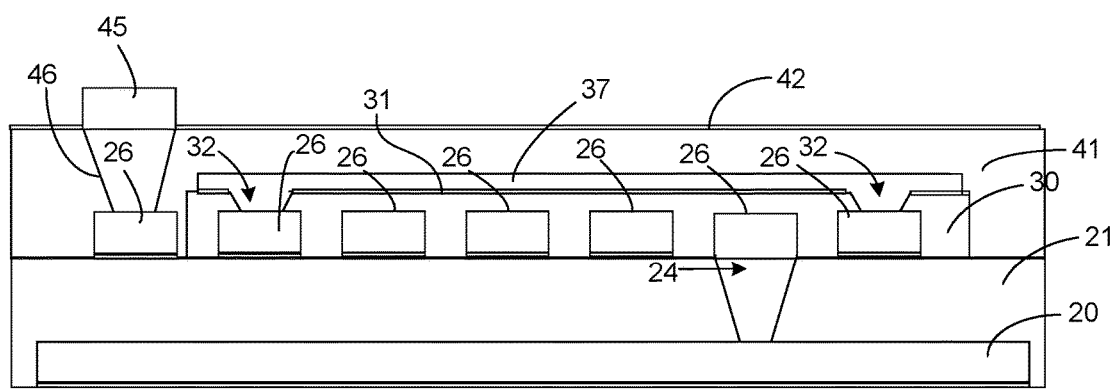

With reference to FIG. 2L, further steps of dielectric film masking and electroplating in unmasked areas can be performed to form a metal layer 45 on top of the copper foil layer 42 and to interconnect metal layer 45 with metal layer 26 with a via 46. For exemplary purposes, it will be assumed that metal layer 45 is the electrical isolation layer that isolates the digital signal routes formed in metal layer 26 from the RF signal routes (not shown), which are formed in PCB layers that are on the opposite side of metal layer 45 from metal layer 26. The exposed portions of the copper foil 42 are then etched away (not shown).

Figure 3A:
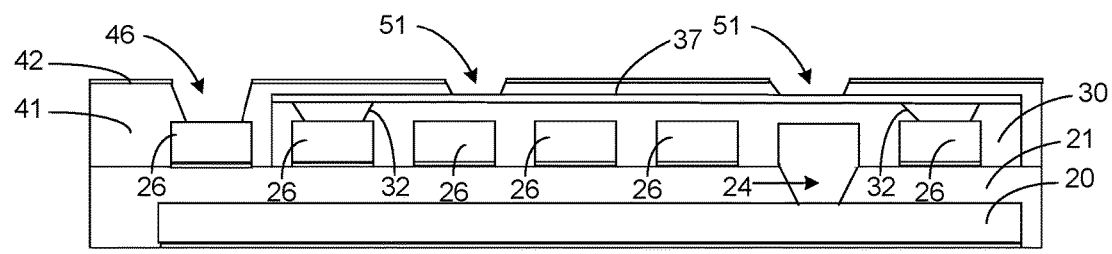
FIGS. 3A-3B illustrate cross-sectional views of a multi-layer PCB as it is built up during fabrication to include the mezzanine redistribution structure in accordance with another exemplary embodiment.
Figure 3B:
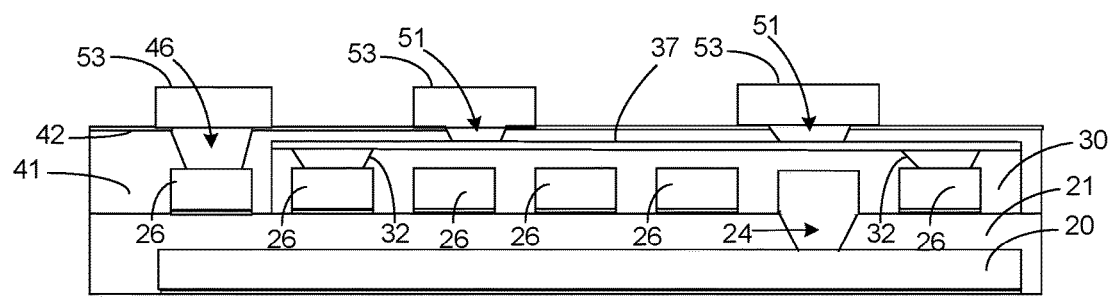
Figure 3C:
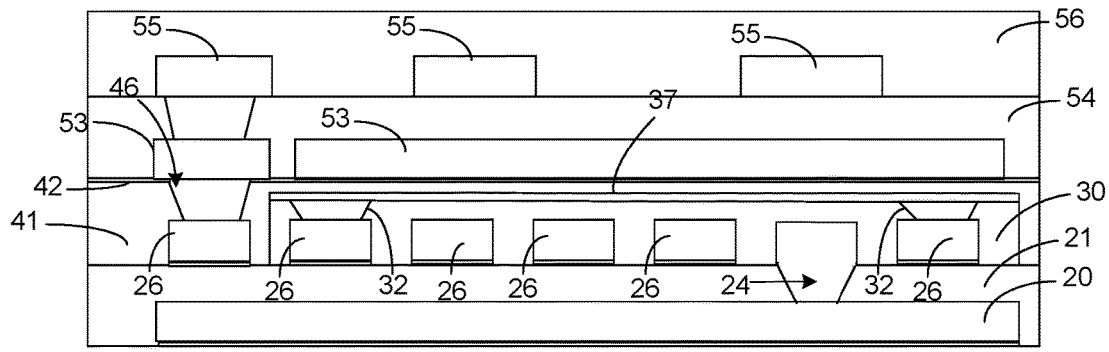
FIG. 3C illustrates a cross-sectional view of the multi-layer PCB shown in FIG. 3B modified by extending the patterned metal layer above the mezzanine redistribution structure and by adding an additional circuit board layer having patterned metal layer comprising RF routing.

The mezzanine redistribution structure 30, 37, 32 may also be used to interconnect the metal layer 26 with one or more metal layers above the mezzanine redistribution structure 30, 37, 32, as will now be described. FIG. 3A illustrates a cross-sectional view of a multi-layer PCB as it is built up during fabrication to include the mezzanine redistribution structure 30, 37, 32. In FIG. 3A, additional via holes 51 have been drilled through the foil 42 and through the dielectric material layer 41 down to the metal layer 37 of the mezzanine redistribution structure 30, 37, 32. After performing the aforementioned electroless process to deposit a thin layer of metal (not shown) on the surfaces of the via holes 51, a patterned metal layer 53 is electroplated onto unmasked portions of the copper foil 42 and onto the vias 46 and 51, as shown in FIG. 3B. The contact between the patterned metal layer 53 and the vias 51 creates electrical connections with the metal layer 37 and with the vias 32 of the mezzanine redistribution structure 30, 37, 32, thereby creating electrical connections with the portions of the patterned metal layer 26 that are in contact with the vias 32. Therefore, the mezzanine redistribution structure 30, 37, 32 increases routing flexibility within the PCB layer in which it is contained, but also between that PCB layer and PCB layers above it. This is accomplished without adding an additional PCB layer and without increasing the total thickness of the PCB. FIG. 3C illustrates a cross-sectional view of the multi-layer PCB shown in FIG. 3B modified by extending the patterned metal layer 53 above the mezzanine redistribution structure 30, 37, 32, covering the patterned metal layer 53 with a dielectric material layer 54, disposing a patterned metal layer 55 on the dielectric material layer 54, and covering the patterned metal layer 55 with a dielectric material layer 56. In FIG. 3C, the patterned metal layer 26, the patterned metal laser 53 and the patterned metal layer 55 represent the aforementioned digital routing, the electrical isolation layer and the RF routing, respectively.

It should be noted that materials other than the PID laminate 30 may be used as the dielectric material of the mezzanine redistribution structure. In general, any non-sacrificial dielectric material that has the properties described above (compatibility with the PCB manufacturing process, good adhesion to metals, flowability, uniformity, suitable dielectric properties) that enables selective material removal without having to drill may be used as the dielectric material. For example, wet-etchable dielectric materials and dielectric ink are available that have these properties and would be suitable for use as the dielectric material of the mezzanine redistribution structure.

While the mezzanine redistribution structure has been described as being located in a PCB layer that is in between the electrical ground layer and the electrical isolation layer of the PCB, it may be located within any PCB layer and can serve any useful purpose, including, for example, as an RF bridge, as a signal cross-over, as a ground plane, as a capacitance structure, as a stress reduction structure, and as an electromagnetic shielding structure.

It should be noted that the invention has been described with reference to a few illustrative embodiments for the purpose of demonstrating principles and concepts of the invention. It will be understood by persons of skill in the art, in view of the description provided herein, that the invention is not limited to these illustrative embodiments. Persons of skill in the art will understand that many variations can be made to the illustrative embodiments without deviating from the scope of the invention.

What is claimed is:

1. A circuit board comprising:
a stack of at least first and second circuit board layers, each circuit board layer comprising a layer of a first type of dielectric material and a layer of metal that may be patterned or unpatterned, a first circuit board layer of the stack of at least first and second circuit board layers comprising a patterned metal layer, one or more of the circuit board layers having one or more electrically-conductive vias formed therein that extend from the metal layer of the respective circuit board layer to the metal layer of an adjacent circuit board layer; and
a mezzanine redistribution structure disposed inside of the layer of the first type of dielectric material of the first circuit board layer, and wherein the mezzanine redistribution structure comprises a non-sacrificial layer of a second type of dielectric material and a mezzanine redistribution layer of metal, the mezzanine redistribution layer of metal forming electrical interconnections between different portions of the patterned metal layer of the first circuit board layer.

2. The circuit board of claim 1, wherein the first type of dielectric material is a resin material.

3. The circuit board of claim 2, wherein the resin material has glass fibers woven throughout the resin material.

4. The circuit board of claim 2, wherein the resin material of all of the circuit board layers except for the first circuit board layer has glass fibers woven throughout the resin material, and wherein the resin material of the first circuit board layer is devoid of the glass fibers.

5. The circuit board of claim 1, wherein at least one of the circuit board layers above the first circuit board layer has a patterned metal layer comprising radio frequency (RF) routes and wherein the patterned metal layer of the first circuit board layer comprises digital routes.

6. The circuit board of claim 5, wherein one of the circuit board layers in between the first circuit board layer and the circuit board layer comprising the RF routes has a metal layer that forms an electrical isolation barrier between RF signals carried on the RF routes and digital signals carried on the digital routes.

7. The circuit board of claim 1, wherein the dielectric material of the second type is a photo-imageable dielectric material laminate.

8. The circuit board of claim 1, wherein the dielectric material of the first type is different from the dielectric material of the second type, and wherein the mezzanine redistribution structure further comprises:
at least first and second electrically-conductive vias formed in the non-sacrificial layer, the first and second electrically-conductive vias having first ends that are in contact with first and second electrically-conductive contacts, respectively, of the patterned metal layer of the first circuit board layer, and wherein the mezzanine redistribution layer of metal extends between second ends of the first and second electrically-conductive vias.

9. The circuit board of claim 8, wherein the first type of dielectric material is a resin material.

10. The circuit board of claim 9, wherein the resin material has glass fibers woven throughout the resin material.

11. The circuit board of claim 9, wherein the resin material of all of the circuit board layers except for the first circuit board layer has glass fibers woven throughout the resin material, and wherein the resin material of the first circuit board layer is devoid of the glass fibers.

12. The circuit board of claim 8, wherein the second type of dielectric material is a photo-imageable dielectric material.

13. The circuit board of claim 8, wherein the second type of dielectric material is a wet-etchable dielectric material.

14. The circuit board of claim 8, wherein the second type of dielectric material is a dielectric ink.

15. The circuit board of claim 8, wherein at least one of the circuit board layers above the first circuit board layer has a patterned metal layer comprising radio frequency (RF) routes and wherein the patterned metal layer of the first circuit board layer comprises digital routes.

16. The circuit board of claim 15, wherein one of the circuit board layers in between the first circuit board layer and the circuit board layer comprising the RF routes has a metal layer that forms an electrical isolation barrier between RF signals carried on the RF routes and digital signals carried on the digital routes.

17. The circuit board of claim 16, further comprising at least a third electrically-conductive via having a first end that is in contact with the metal layer that forms the electrical isolation barrier and a second end that is in contact with the mezzanine redistribution layer of metal.

18. The circuit board of claim 16, further comprising at least a third electrically-conductive via having a first end that is in contact with the metal layer of the circuit board layer that is below the first circuit board layer in the stack and having a second end that is in contact with an electrically-conductive contact of the patterned layer of metal of the first circuit board layer.

19. The circuit board of claim 8, wherein the second type of dielectric material is a laminate.

20. The circuit board of claim 8, wherein the mezzanine redistribution structure has a height that is less than or equal to about 40 micrometers, and wherein the layers of the first type of dielectric material have a uniform height that is greater than the height of the mezzanine redistribution structure.

* * * * *